(12) United States Patent
Chowdhury et al.

(10) Patent No.: US 6,268,289 B1
(45) Date of Patent: Jul. 31, 2001

(54) METHOD FOR PROTECTING THE EDGE EXCLUSION OF A SEMICONDUCTOR WAFER FROM COPPER PLATING THROUGH USE OF AN EDGE EXCLUSION MASKING LAYER

(75) Inventors: Rina Chowdhury; Ajay Jain; Olubunmi Adetutu, all of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/080,809

(22) Filed: May 18, 1998

(51) Int. Cl.[7] .................................................. H01L 21/44
(52) U.S. Cl. ..................... 438/687; 438/644; 438/685; 438/678
(58) Field of Search ................... 438/687, 678, 438/628, 666, 645, 3, 644, 685; 216/106; 428/209

(56) References Cited

U.S. PATENT DOCUMENTS

| | | | |
|---|---|---|---|
| 4,954,214 | * | 9/1990 | Ho ........................................ 4383/628 |
| 5,814,557 | * | 9/1998 | Venkatraman et al. .............. 438/622 |
| 5,824,599 | * | 10/1998 | Schacham-Diamand et al. .. 438/678 |
| 5,891,513 | * | 4/1999 | Dubin et al. ........................... 427/98 |
| 5,907,790 | * | 5/1999 | Kellam .................................. 438/666 |
| 5,913,147 | | 6/1999 | Dubin et al. ........................... 438/687 |
| 5,933,758 | * | 8/1999 | Jain ....................................... 438/687 |
| 5,968,333 | * | 10/1999 | Nogami et al. ....................... 205/184 |
| 5,969,422 | * | 10/1999 | Ting et al. ............................. 257/762 |
| 6,054,173 | * | 4/2000 | Robinson et al. ..................... 427/98 |
| 6,069,068 | * | 5/2000 | Rathore et al. ....................... 438/628 |

OTHER PUBLICATIONS

Dubin et al., "Selective and Blanket Electroless Copper Deposition for Ultralarge Scale Integration," J. Electrochem. Soc., vol. 144, No. 3. pp. 898–908 (1997).

DeSilva et al., "A Novel Seed Layer Scheme to Protect Catalytic Surfaces for Electroless Deposition," Electgrochem. Soc., vol. 143, No. 11, pp. 3512–3516 (1996).

Jagannathan et al., "Electroless Plating of Copper at a Low pH Level," IBM J. Res. Develop. vol. 37, pp. 117–123 (1993).

Min, et al., "Electroless coper deposition on TiN," Abstract No. 454, IMEC, pp. 550–551.

Weber, et al., "STM Study on the Effect of Cyanide during Electroless Copper Deposition," Pennsylvania State University, Abstract No. 447, pp. 541–542.

* cited by examiner

*Primary Examiner*—Mahshid Saadat
*Assistant Examiner*—José R. Diaz
(74) *Attorney, Agent, or Firm*—Keith E. Witek; George R. Meyer

(57) ABSTRACT

A method for forming a copper interconnect begins by depositing a barrier layer (48) within an in-laid region (18). An edge exclusion protection layer (50) is formed over the barrier layer (48), and this layer (50) is processed so that it only lies within the edge exclusion region (20) of the wafer. The layer (50) is removed from active area portions of the wafer so that contact resistance of copper interconnects is not affected. Wet surface processing is used to form a catalyst (64*b*) on the wafer surface to enable electroless copper plating within active areas of the wafer to form a copper seed layer (52). The layer (52) is not formed in an edge exclusion region (20). Electroplating is then used to thicken the copper material to form a copper layer (54) over the layer (52) wherein the in-laid copper interconnect is completed.

26 Claims, 5 Drawing Sheets

US 6,268,289 B1

METHOD FOR PROTECTING THE EDGE EXCLUSION OF A SEMICONDUCTOR WAFER FROM COPPER PLATING THROUGH USE OF AN EDGE EXCLUSION MASKING LAYER

CROSS REFERENCE TO RELATED APPLICATION

This application generally relates to "A Method for Preventing Electroplating of Copper on an Exposed Surface at the Edge Exclusion of a Semiconductor Wafer", by Ajay Jain, filed May 12, 1997, U.S. PTO Ser. No. 08/854,735, now U.S. Pat. No. 5,933,758.

FIELD OF THE INVENTION

The present invention relates generally to semiconductor manufacturing, and more particularly to, preventing adverse copper electroplating at the edge of a semiconductor wafer while forming inlaid contacts with improved conductivity.

BACKGROUND OF THE INVENTION

In the integrated circuit (IC) industry, copper interconnects are typically utilized to connect one electrical point to another electrical point along the surface of a semiconductor wafer. In order to form these copper interconnects, a copper electroplating or electroless process is typically utilized to form a blanket copper layer over the wafer. This blanket copper layer is then chemically-mechanically polished to form the copper interconnects within trenches previously etched in dielectric material. However, conventional blanket copper electroplating or electroless plating causes some adhesion problems at the periphery of the semiconductor wafer which increases particulate problems and reduces yield.

As an example, FIG. 1 illustrates the prior art copper electroplating operation. In FIG. 1, a base layer 11 or substrate 11 is provided. The base layer 11 contains the semiconductor wafer along with any dielectric and conductive layers needed over the semiconductor wafer to form active electrical devices. In order to connect these electrical devices to each other over the wafer surface, a barrier layer 13 is first formed over the substrate 11. The barrier layer 13 prevents subsequently-formed copper regions from adversely affecting underlying semiconductor and metallic regions. Overlying the barrier layer 13 is formed a seed layer 15. It has been found in the art that the seed layer 15 should be separated from the edge of the substrate 11 by an edge exclusion distance 20 as illustrated in FIG. 1. The edge exclusion region 20 is utilized for the electroplating operation to avoid some wafer edge-effect problems, but the edge exclusion also creates some material interface problems as discussed below.

If seed layer 15 were to extend to the very edge of the wafer 11, then the copper electroplating operation would result in copper material forming beyond the edge of the wafer and potentially down a sidewall and backside of the wafer. This additional sidewall and backside material cannot be removed by conventional chemical etching or chemical mechanical polishing. This peripheral copper formation would thereby create sidewall abnormalities that could result in damage to the wafer or the inability of the wafer to be properly processed within semiconductor equipment. Therefore, the seed layer 15 is separated from the edge of the wafer 11 via the exclusion region 20 to avoid these problems, but this exclusion region creates yet another problem discussed below.

After formation of the seed layer, the seed layer 15 is exposed to a liquid electroplating bath whereby a copper layer 17 is electroplated not only from the seed layer 15 but from exposed portions of the barrier layer 13 in the edge exclusion region 20 as illustrated in FIG. 1. The seed layer 15 will electroplate copper more effectively than the barrier layer 13 thereby resulting in the edge exclusion copper topography illustrated in FIG. 1 for the copper layer 17. Note that due to the exclusion region, copper region 17 is now in direct contact with a barrier region 13.

As illustrated in FIG. 2, adhesion between a copper layer 17 and a typical barrier layer 13, such as titanium nitride (TiN), is extremely poor. Therefore, when copper 17 is in contact with the barrier 13 in the exclusion region 20, as illustrated in FIG. 2, flaking or peeling 19 between the copper 17 and the barrier 13 is inevitable. This flaking, delamination, or peeling 19 between the copper 17 and the barrier layer 13 in the edge exclusion region 20 reduces the yield of semiconductor devices and creates particulate problems in processing chambers. Device yield along the periphery of the wafer is impacted most profoundly.

This problem has been solved or reduced in severity by placing an intermediate layer between the layer 13 and the seed 15. However, this additional intermediate layer, while preventing the peeling shown in FIG. 2, is usually more resistive that desired and will increase the resistivity of the inlaid interconnects and contacts formed over the IC. This increase in resistivity is clearly disadvantageous even though the peeling problem of FIG. 2 is reduced or avoided.

Therefore, a need exists for a copper electroplating process which prevents electroplating of copper on an exposed edge exclusion region of a semiconductor wafer whereby barrier material is not placed in contact with electroplated copper.

Figure 1:
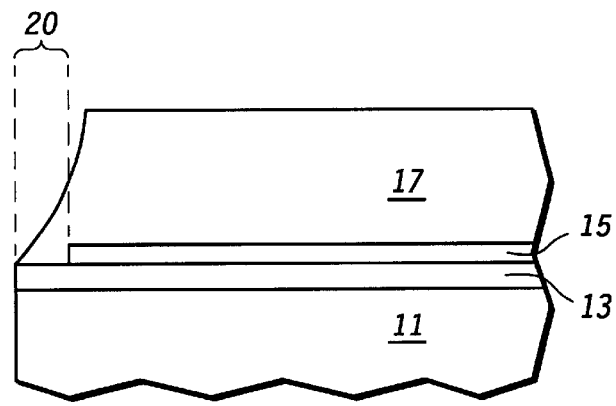
FIG. 1 illustrates, in a cross sectional diagram, a prior art method for electroplating copper on a semiconductor wafer.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, embodiment of the present invention forming copper barrier layer within an inlaid or dual in-laid interconnect region. This copper barrier layer preferably is comprised of tungsten nitride ($W_xN$). An electroplating barrier layer, such as tungsten silicide ($WSi_x$) is then formed over the copper barrier layer. This electroplating barrier layer is etched away from all portions of the wafer except the edge exclusion region of the wafer by an acidic spray or acidic bath. This removal will ensure adequate edge exclusion protection to avoid the peeling of FIG. 2 while simultaneously ensuring that this electroplating barrier layer is not located within active electrical interconnects whereby the conductivity of these active electrical interconnects are improved.

Once the removal of portions of the electroplating barrier is complete, the copper barrier layer is exposed in a central portion of the wafer where active electrical interconnects reside. These exposed portions of the copper barrier layer are exposed to a basic conditioning spray or bath to provide the surface with a uniformity of polarity to facilitate adsorption of activator compounds subsequently deposited. This act is followed by an activator pre-dip via a spray or bath wherein this is acidic and removes surface oxide from the exposed copper barrier layer and changes the polarity of the surface of the wafer from negative to positive. Next, a thin monolayer of material is deposited where this layer functions as a catalyst for subsequent electroless copper processing. This catalyst typically comprises palladium and tin where the tin is selectively removed from this layer by another spray or bath act that follows the act of forming the catalytic layer. Tin is preferably removed, since tin is not an active electroless species as in palladium.

After forming this catalytic layer, a copper electroless operation is used to form a copper seed layer onto the catalyst layer and the exposed portions of the copper barrier layer (which is preferably $W_xN$). After this electroless operation, the copper region is thickened by using an electroplating operation. This electroplating operation will not plate substantially on the edge of the wafer due to presence of the electroplating barrier layer, such as tungsten silicide ($WSi_x$), within the edge exclusion region. The result is a copper interconnect that has limited disadvantageous copper plating in the edge exclusion region, while the copper interconnects have improved conductivity due to lack of electroplating barrier over active area.

The invention can be further understood with reference to FIGS. 3–12.

Figure 3:
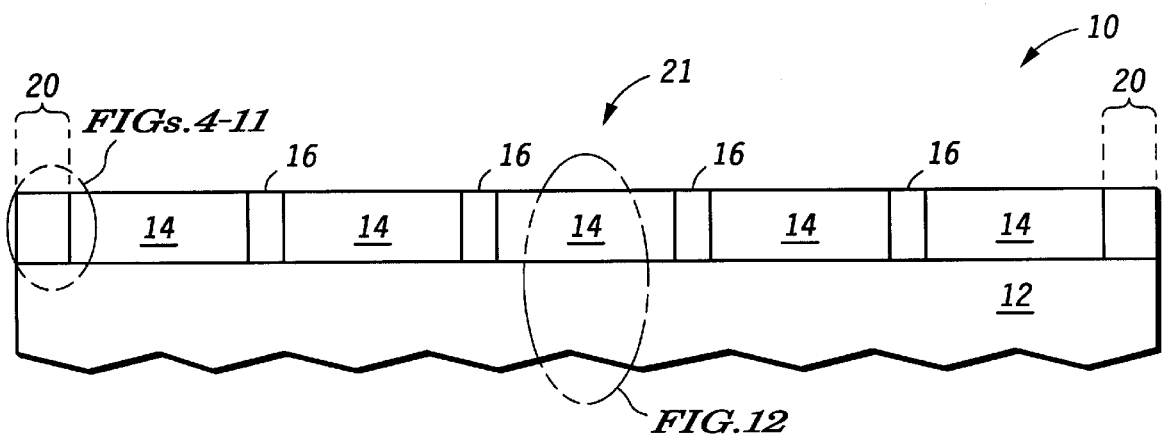
FIG. 3 illustrates, in a cross sectional diagram, a semiconductor wafer in accordance with an embodiment of the present invention.

FIG. 3 illustrates a semiconductor substrate 10. In a preferred form, the semiconductor substrate 10 is a silicon wafer. However, the processing taught herein can be utilized for flat panel displays, multi-chip modules (MCMs), other semiconductor wafers or substrates such as germanium wafers, silicon carbide, epitaxial regions, germanium-silicon wafers, and gallium arsenide wafers, and like substrate materials. In the most preferred form, the semiconductor substrate 10 comprises a silicon wafer 12 which is substantially circular in shape. Integrated circuits 14 are formed overlying the semiconductor wafer 12 as illustrated in FIG. 3. The integrated circuit die 14 of FIG. 3 are separated from one another by scribe lines 16. Scribe lines 16 are present so that the integrated circuits 14 can be segmented from one another to form a plurality of singulated integrated circuits 14 which are then subsequently packaged for consumer use.

Around a circular periphery of the wafer 12 is an edge exclusion region 20. The exclusion region 20 identifies a periphery portion of the wafer wherein the copper electroplating and electroless plating should not occur in order to improve integrated circuit yield by avoiding the problems identified in FIGS. 1–2. This edge exclusion portion is magnified and illustrated via FIGS. 4–11 herein to illustrate the specific process by which copper electroplating and electroless plating in an edge exclusion region 20 is either reduced or completely eliminated whereby integrated circuit yield is improved. Furthermore, FIG. 12 illustrates a magnified portion of an integrated circuit device 14, as identified in FIG. 3, after significant acts of the processing are complete. FIG. 12 illustrates the internal contents of a typical IC 14 which is formed via the edge exclusion process taught in FIGS. 4–11. All of the functional integrated circuits 14 of FIG. 3 lie within a central portion 21 of a semiconductor wafer 12 whereby the lack of electroplating occurring within the exclusion region 20 will not affect functional integrated circuit (IC) formation.

Figure 4:
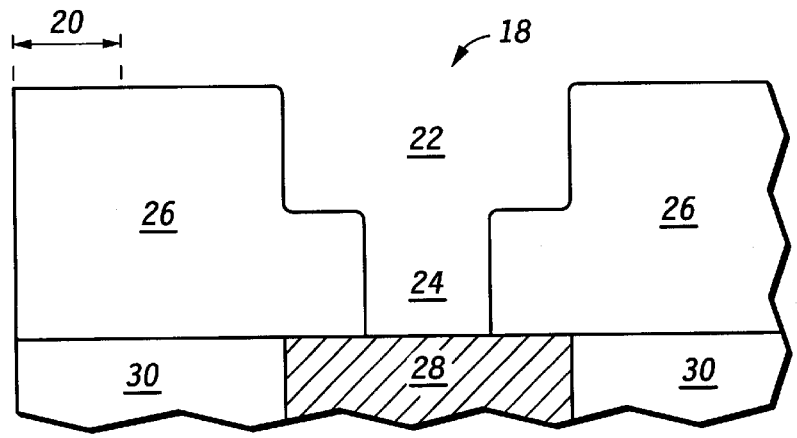
FIGS. 4–11 illustrate, in cross sectional diagrams, a method for forming an improved edge exclusion region for use with copper electroless plating and electroplating which avoids or reduces prior art delamination problems in accordance with an embodiment of the present invention.

FIGS. 4–11 illustrate a magnified view of the edge exclusion region 20 and a portion of an integrated circuit (IC) portion 14 identified in FIG. 3. FIG. 4 illustrates that an inter-level dielectric (ILD) 30 is formed. Typically, the inter-level dielectric (ILD) 30 is a tetraethylorthosilicate (TEOS) layer, borophosphosilicate glass (BPSG), thermal oxide, low-K dielectric material, spin on glass (SOG), like dielectric materials, or some combination thereof. This layer 30 is lithographically patterned and etched using conventional techniques. These vias and/or trenches can form conventional interconnect structures, single in-laid structures, or dual in-laid structures as taught herein in FIGS. 4–7. Therefore, conductive interconnects and/or conductive contacts 28 are formed within openings of the inter-level dielectric 30 in order to form one or more metallic interconnects. Note than one or more local interconnect layers, such a polysilicon, aluminum, or tungsten, may underlie the layer 28. Typically, the interconnect 28 is formed from copper using a process identical to or similar to the process taught in FIGS. 4–11. However, the layer 28 may be formed from aluminum, aluminum-copper, aluminum-silicon-copper, silver, gold, or any other like metallic conductive material or composite thereof.

After formation of the metal interconnect 28, one or more inter-level dielectric (ILD) layers 26 are formed as illustrated in FIG. 4. A dual in-laid structure is etched within the inter-level dielectric (ILD) 26. The dual in-laid structure 18 contains trench portions 22 and via portions 24 as illustrated in FIG. 4. The via portions 24 are, in most devices, a plurality of via portions separated from one another along the semiconductor wafer. Multiple vias are needed to make electrical contact to one or more underlying conductive interconnect regions such as region 28 of FIG. 4. The separated and segmented regions 24, dispersed across the wafer to contact various underlying conductive regions, are interconnected selectively to one another via the trench portions 22. Together the trench portions 22 and via portions 24 form the one or more dual in-laid structures over the surface of the wafer.

In a preferred form, the region 26 is formed by first depositing a plasma enhanced nitride (PEN) passivation layer over the top of layer 28. This PEN layer (not specifically illustrated in FIG. 4) is then followed by a first TEOS deposition to form a TEOS region laterally adjacent to the opening 24. Then, an etch stop layer (not specifically illustrated in FIG. 4) is typically formed above this first deposited TEOS layer in order to allow for easier etch processing when forming the different regions 22 and regions 24 of FIG. 4. This etch stop layer, would reside at or near the interface between the opening 24 and the opening 22 if specifically illustrated in FIG. 4. Etch stop layers are usually silicon nitride layers or like layers of material. After formation of this etch stop layer, a second TEOS deposition is used to form the TEOS material which is laterally adjacent the opening or trench 22 in FIG. 4.

Typically, a thickness of the TEOS layer 30 and the first metallic layer 28 is roughly 4000–5000 angstroms in thickness. The entire layer 26 in FIG. 4 is typically on the order of 13,000 angstroms with the via portion being roughly 8000 angstroms in depth and the trench portion 22 being roughly 5000 angstroms in depth. The openings 22 and 24 are processed by conventional TEOS etch technology such as the use of plasma $CF_4$ and $CHF_3$ processing.

Figure 2:
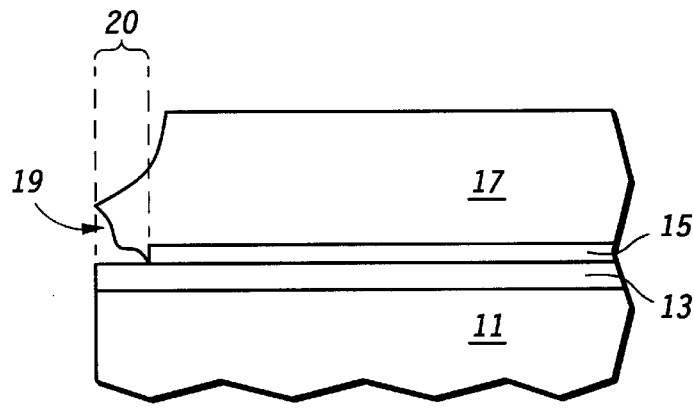
FIG. 2 illustrates, in a cross sectional diagram, a prior art problem of edge exclusion peeling or delamination which reduces integrated circuit yield and increases particle problems in processing chambers.

FIG. 4 also clearly illustrates the edge exclusion region 20 as previously illustrated in FIGS. 1–3. In a preferred form, the edge exclusion region 20 is 2 mm in width and surrounds an outer peripheral surface of the circular wafer 12. However, the edge exclusion can be altered in thickness around an optimal width of 2 mm so that edge exclusion regions of roughly 1 mm to 3 mm or more will be fully functional.

Figure 5:
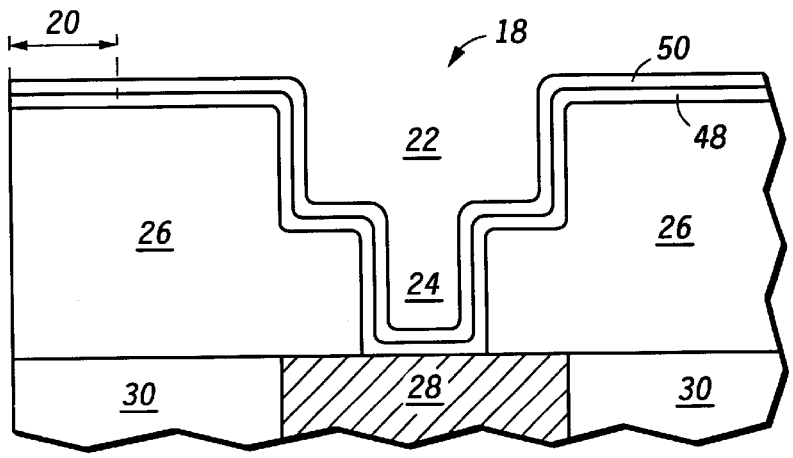

FIG. 5 illustrates that a barrier layer 48 is deposited over the inter-level dielectric 26 and within the dual inlaid contact openings 22 and 24. In a preferred form, the layer 48 is a tungsten nitride ($W_xN$) layer which is formed by chemical vapor deposition (CVD). In yet another form, the layer 48 may be a composite barrier which comprises a tungsten nitride ($W_xN$) portion. For example, the layer 48 may comprise titanium-tungsten, titanium nitride, other refractory nitrides, a refractory silicide, tantalum silicon nitride, molybdenum, and/or like barrier layers in addition to or in lieu of the $W_xN$ layer 48. In a preferred form, layer 48 is roughly 200 angstroms in thickness, however, this thickness can be altered +/−100 ansgtroms or so while still rendering a functional device.

Overlying the barrier 48 is formed an intermediate layer 50.

Preferably, an additional CVD act, sputter and heating act, or the like is used to form the intermediate layer 50 as a layer of tungsten silicide ($WSi_x$). When CVD is used, the thickness of the layer 50 is roughly 50 angstroms. In yet another form, intermediate layer 50 is formed by placing the semiconductor wafer in a vacuum environment and exposing the semiconductor wafer to a silane ($SiH_4$) plasma. The silane plasma is generated in a high density plasma chamber, such as an Applied Materials Centura chamber, utilizing a chamber power of roughly 100 Watts. The heater within the chamber is set to roughly 450° C. whereby the substrate/wafer temperature is roughly 360° C. Silane is flowed into the chamber at a rate of roughly 10 ccm at a chamber pressure of roughly 1 Torr. In addition to the 10 ccm silane flow, roughly 600 ccms of Argon flow is used as an inert carrier for the silane. This exposure of the barrier layer 48 to a silane plasma is very brief in time and is typically on the order of roughly one second in duration. This short exposure to a silane plasma will form a thin (e.g., roughly 2 angstrom to 20 angstrom) silicon comprising film 50 on the surface of the barrier layer 48.

Specific processing parameters used to form the layer 50 are described hereinabove. However, it should be understood that the preferred pressure of 1 Torr can be altered between 1 mTorr and atmospheric pressure (preferably between 100 mTorr and 3 Torr). The preferred temperature of 450° C. can be varied between room temperature and 500° C. The flow rate of silane can be changed between 1 ccm and 500 ccms with the Argon flow changing accordingly. Typically, the ratio of silane to Argon is on the order of 1:50. The time of exposure, as taught hereinabove, can be set to a time duration between a fraction of a second and several seconds.

The resulting intermediate layer 50 on the surface of the barrier layer 48 is a silicon-containing material. Initially, the layer 50 is formed as preferably a 6 angstrom thick silicon (Si) layer when using silane exposure formation techniques. However, the silicon layer, under certain ambient conditions, will quickly react with any refractory metal, such as tantalum, titanium, molybdenum, etc., contained within the barrier layer 48. Therefore, the 6 angstroms of silicon deposited on the surface on the wafer to form the layer 50 from the silane plasma may be either: (1) a complete layer of unreacted silicon; (2) a composite of silicon and a refractory silicide formed from reaction with layer 48; or (3) may be an entirely consumed silicon layer whereby layer 50 is an entire refractory silicide material. In any event, silicon from the silane plasma adheres to the barrier layer 48 to form a very thin 2 to 20 angstrom (preferably 6 angstrom) layer 50 which comprises silicon atoms and is at least semiconductor in resistivity. If CVD is used to form the layer 50, the layer will be somewhat thicker and typically be on the order of 50 angstroms in thickness.

It should be noted that the silicon layer 50 can be doped with one or more of boron, phosphorous, arsenic, and or like Si-compatible dopant atoms in order to change the composition of this thin layer 50. Notice that the intermediate layer 50 is formed both in the central portion 21 of the wafer and the edge exclusion portion 20 of the wafer to entirely cover the barrier layer 48 in FIG. 5. In addition, the layer 50 may optionally be oxidized by exposure to an cleanroom ambient or a thermal oxidizing environment.

In other embodiments, the silane plasma used herein can be replaced with a different plasma or a sputter process such that the layer 50 can be formed by one or more of: magnesium, germanium, aluminum, or a like conductive material or composite thereof. In a preferred form, a layer selected for use as the intermediate layer 50 should be a conductive or semiconductive material when deposited so that the layer 50 does not adversely effect contact resistance. However, the material used to form layer 50 should also be readily oxidized under specific environmental constraints or inert to the subsequent copper electroplating process (see FIG. 7).

Figure 6:
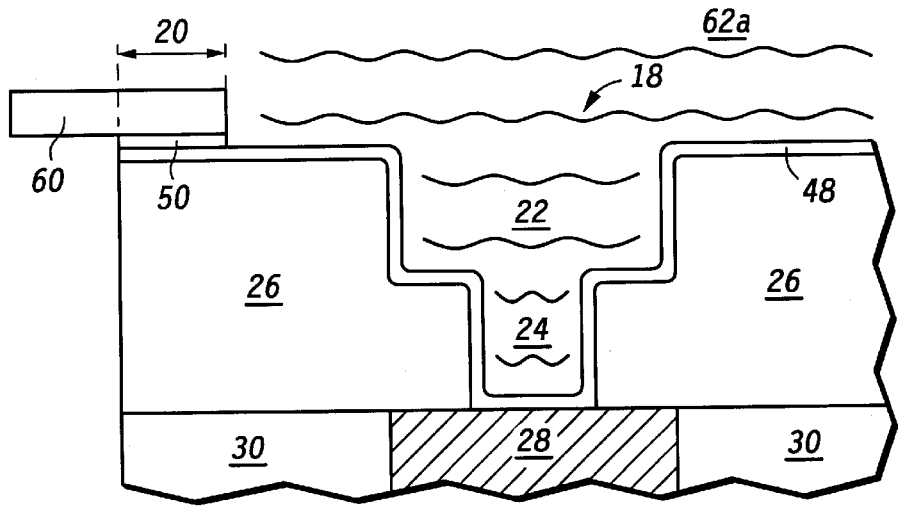

In FIG. 6, the wafer is clamped around its edge exclusion periphery 20 with a clamp ring 60. The wafer is then exposed to a silicide etch environment 62a which will isotropically remove portions of the layer 50 from the substrate via a chemical spray or a liquid bath. This removal process is selective to the underlying layer 48. It is important to note that the clamp 60 protects the portions of the layer 50 lying within the edge exclusion region 20 of the wafer where no additional photoresist coating, developing or masking acts are needed in a preferred form. A typical spray or bath used to perform the removal in FIG. 6 is an acidic environment, such as HF. The temperature of this process is typically room temperature, and the time of exposure is roughly 5–10 seconds since the film 64a is very thin. At these short exposure times, lateral recessing of the layer 50 under the clamp 60 is minimized. After the acidic exposure whereby removal of portions of the layer 50 is complete, a deionized (DI) water rinse act is used to rinse the acid off of the wafer.

Figure 7:
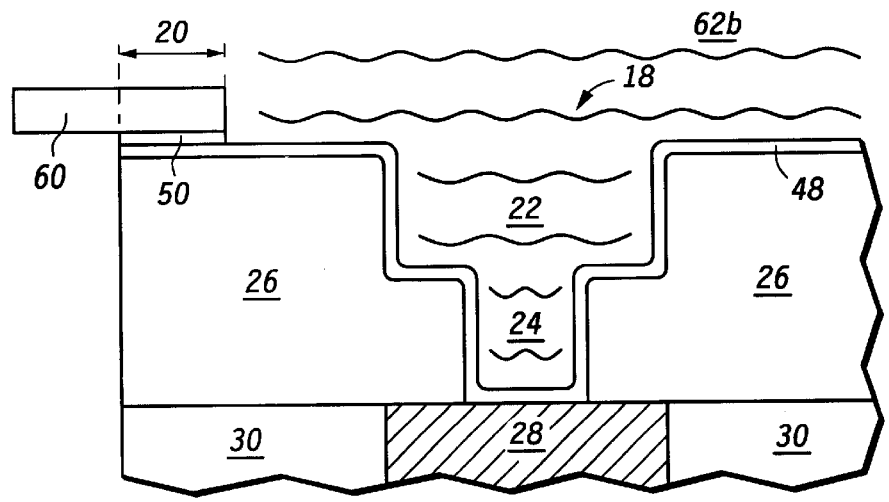

FIG. 7 illustrates that the wafer is then exposed to a basic spray or basic bath 62b to provide the wafer surface with a uniformity of polarity to facilitate adsorption of a subsequently deposited catalyst for copper electroless nucleation.

The typical wet chemistry used for this step is preferably M-Condition A, B, and C supplied by MacDermid Inc. Exposure time is roughly 1–2 minutes and the temperature is roughly 40–50° C. Following this basic exposure is a brief DI water rinse to remove excess chemicals from the surface of the wafer.

After this wafer exposure, the basic bath or spray 62b is changed to an acidic bath or acidic spray to remove surface oxide from exposed portions of the layer 48. In addition, this exposure provides drag-in of a common ion and common pH for subsequent processing. No rinse follows this acidic exposure in a preferred embodiment. The typical wet chemistry used for this act is M-Predip L supplied by MacDermid Inc. Time of exposure is roughly 30 seconds, and solution temperature is preferably kept at room temperature.

Figure 8:
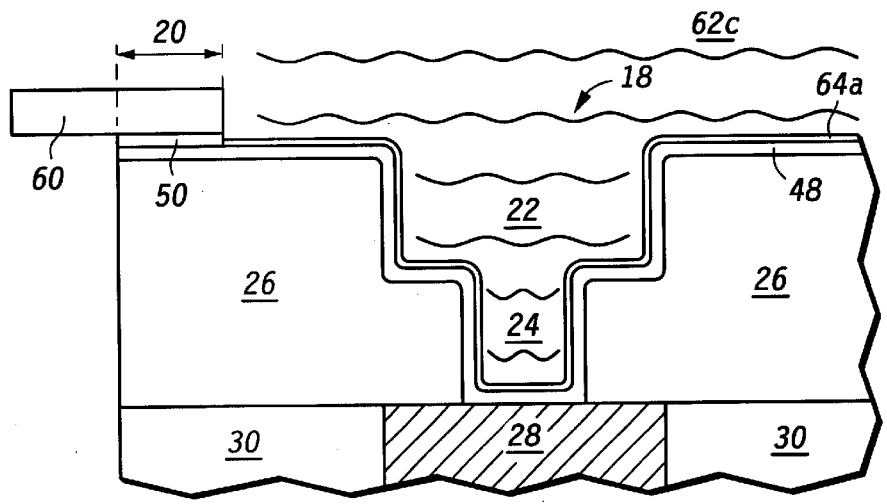

After the processing of FIG. 7, FIG. 8 illustrates that the wafer is exposed to a surface activation act to form a catalytic layer 64a. The layer 64a is eventually used for electroless copper deposition onto the layer 48. The layer 64a is formed by exposing the wafer to an acidic spray or acidic bath 62c. The temperature of this exposure is roughly 30–35° C. for a time period of roughly two minutes. The typical wet chemistry used for this act is M-Predip L mixed with M-Activate, both being supplied by MacDermid Inc. A DI water rinse act follows this exposure procedure of FIG. 8.

The exposure, shown in FIG. 8, forms a thin monolayer of material 64a over the surface of exposed portions of the layer 48. This layer is preferably a material comprising tin and palladium, while any other metallics which are catalytic to copper electroless plating may be used in place of tin and/or palladium. Therefore, in a preferred form, the layer 64a of FIG. 8 will contain both tin atoms and palladium atoms when first deposited onto the wafer.

Figure 9:
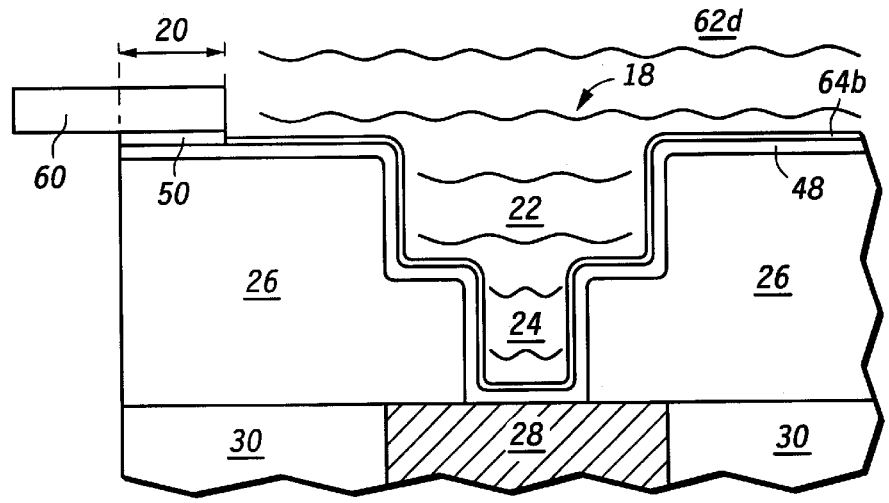

FIG. 9 illustrates that the wafer is exposed to a basic spray or basic bath 62d to remove tin from the palladium/tin layer 64a to convert layer 64a to a layer 64b comprising mostly active palladium species. The typical wet chemistry used for this act is M-Accelerate A and B, both being supplied by MacDermid Inc. Temperature is roughly 40–50° C. and the exposure time is roughly 15–35 seconds. A DI water rinse process follows this surface processing act.

Figure 10:
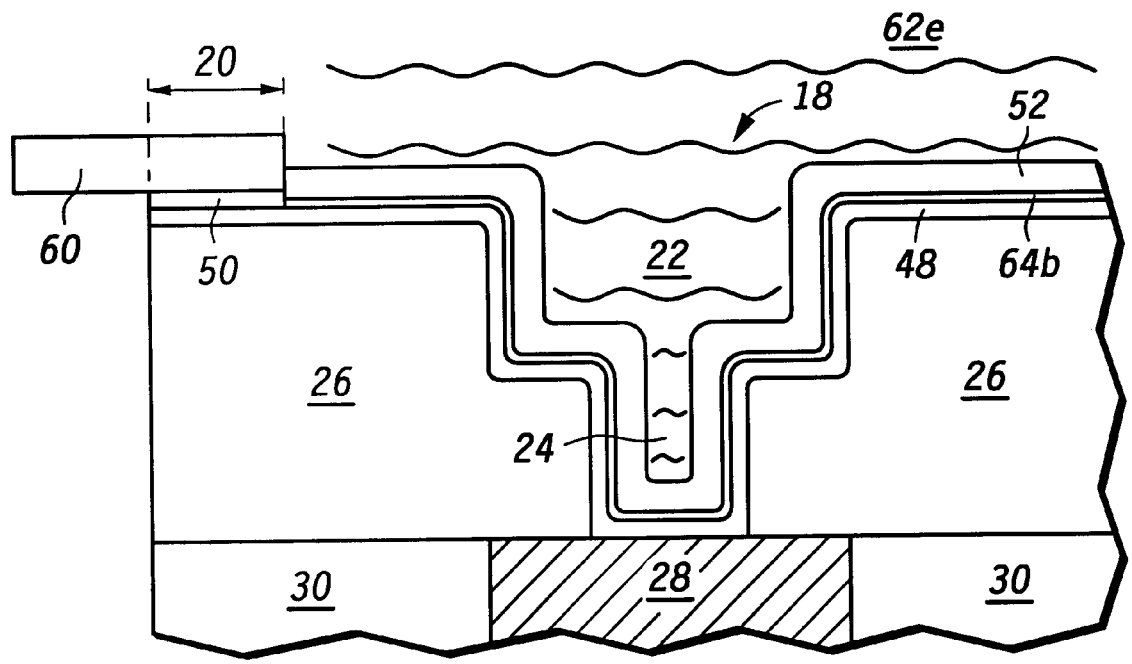

FIG. 10 illustrates that a copper seed layer 52 is formed over the surface of the wafer 12 using an electroless copper deposition process. This seed layer 52 is formed within the central portion 21 of the wafer 18 but is formed so that it does not overly overlie the edge exclusion portion 20 of the wafer as shown in FIG. 6 due to the exposed portions of the layer 50 around the edge exclusion portion 20 of the wafer. The layer 52 is typically formed to a thickness of roughly 300–400 angstroms. The chemical bath 62e used to form the layer 52 is a mixture of M-Copper 85B, 85A, 85D, and 85G (all being supplied by MacDermid Inc.) with formaldehyde being used as a reducing agent. Processing temperature for this act is room temperature and the exposure time is roughly two minutes.

FIG. 10 illustrates that the edge exclusion region 20 is protected from electroless plating by the clamp ring 60 or by the layer 50. As long as the layer 50 is not covered with the palladium seed, no copper will plate on the edge exclusion region 20 in FIG. 10 even if the clamp 60 is removed.

The seed layer 52 of FIG. 10 has various advantages over the conventional PVD or CVD copper seed layer. First, the step coverage of the electroless plated copper seed in FIG. 10 is improved over PVD or CVD step coverage. In addition, electroless plating is more capable of filling smaller features sizes and larger aspect ratio regions than either CVD or PVD. Some forms of CVD copper have high resistance and therefore adversely affect IC performance.

Figure 11:
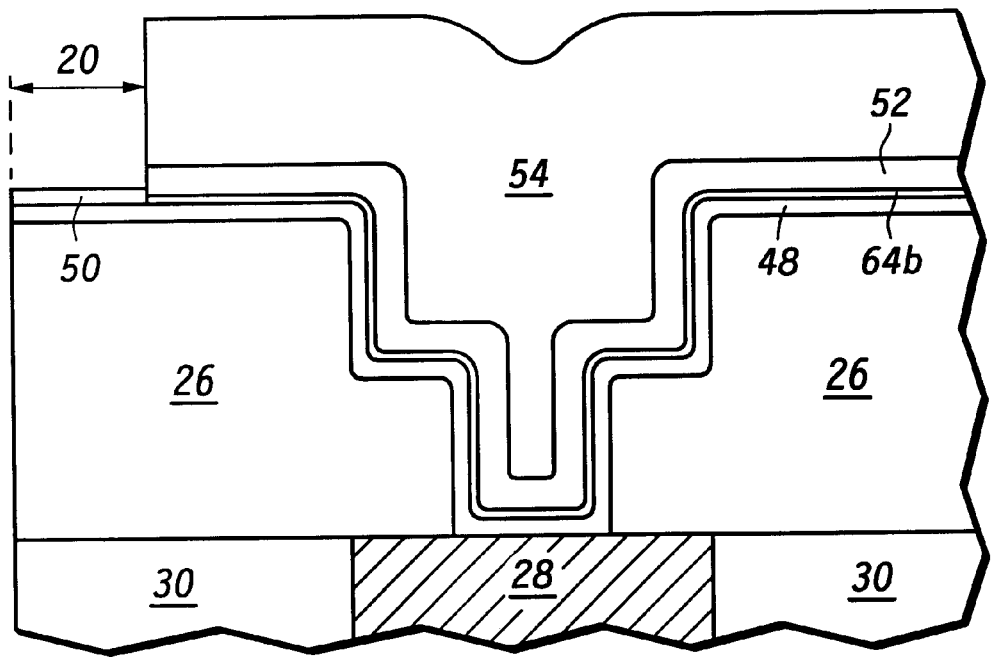
Figure 12:
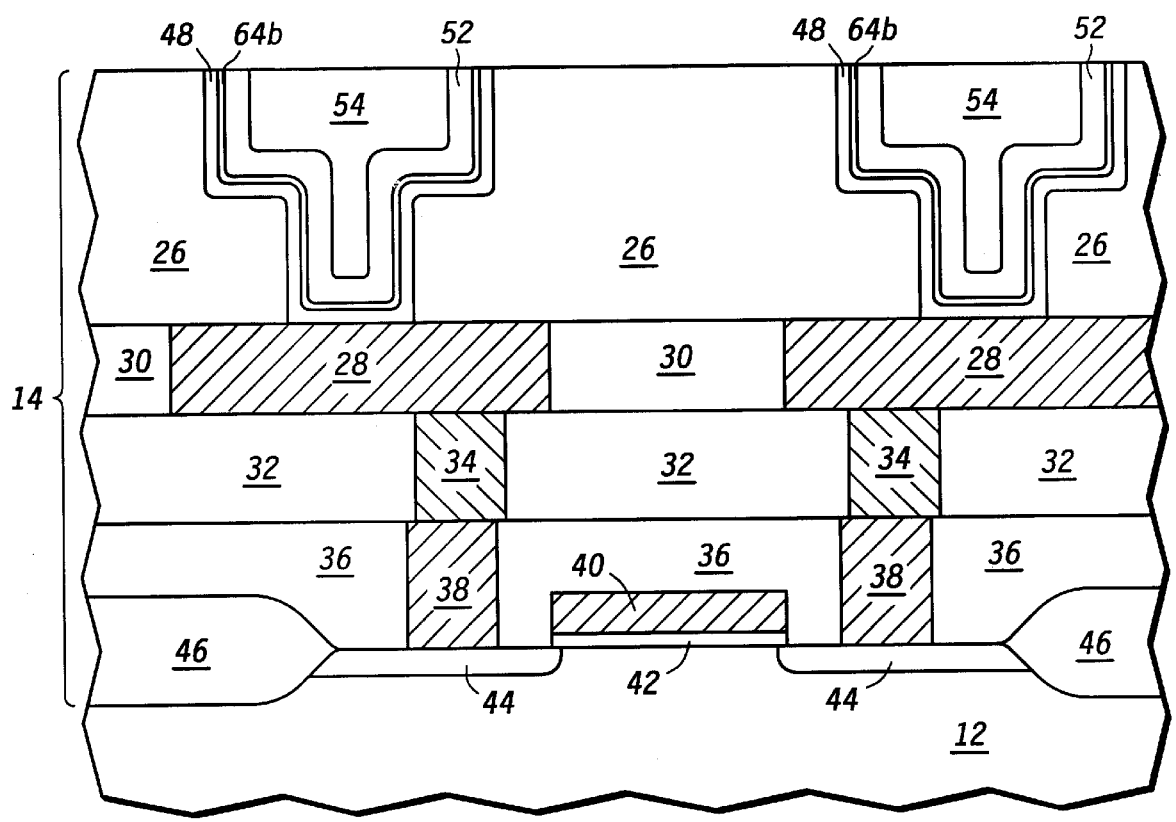
FIG. 12 illustrates, in a cross sectional diagram, a typical integrated circuit portion which is fabricated in accordance with an embodiment of the present invention.

FIG. 11 illustrates that the wafer 12 is then exposed to a liquid electroplating environment in an electroplating chamber which are available in the art via Semitool. The copper (Cu) electroplating environment will result in copper adhering to the seed layer 52 wherein no copper or a negligible amount of copper will be electroplated on the surface of silicon-containing layer 50 in the exclusion region 20 of FIG. 11. Electroplating continues to occur from the seed layer 52 and continues to be prevented on the silicon-containing layer 50 until a thick copper interconnect layer 54 is formed as illustrated in FIG. 11. This copper interconnect and any conductive layer taught herein may be chemically mechanically polished (CMP) in order to improve planarity or form single in-laid or dual in-laid contact structures (see FIG. 12). Notice that no copper electroplating or a negligible amount of copper electroplating occurs over the silicon-containing layer 50 in the exclusion region 20. Therefore, unlike the prior art illustrated in FIGS. 1–2 herein, no copper material 52 or 54 is directly in contact with any barrier $W_xN$ material 48. Therefore, no peeling or delamination 19 as illustrated in FIG. 2 will occur for the wafer illustrated in FIG. 11 whereby particle contamination is reduced and integrated circuit (IC) die yield is improved.

FIG. 12 illustrates a magnified central portion of FIG. 3 as defined in the drawings. FIG. 12 clearly illustrates the wafer silicon substrate 12 of FIG. 3. Active devices, such as the transistor clearly illustrated in FIG. 12, are formed overlying the semiconductor substrate 12. The transistor of FIG. 12 contains source and drain electrodes 44 separated by a channel region in the substrate 12. The transistor is isolated from other devices via field oxide regions 46 or like isolation structures such as dielectric-filled trenches. A gate oxide 42 is illustrated in FIG. 12 along with an overlying gate electrode 40. The gate electrode 40 is typically formed from polysilicon or amorphous silicon doped to a predetermined level.

An inter-level dielectric (ILD) 36 is then formed from one or more of TEOS and/or borophosphosilicate glass (BPSG). Contacts are lithographically patterned and etched through the ILD 36 to form tungsten (W) plugs 38 as illustrated in FIG. 12. Tungsten plugs typical comprise barriers similar to that taught herein for dual-inlaid copper structures. A second level of processing is used to form tungsten (W) plugs 34 as well as a second inter-level dielectric layer 32 as illustrated in FIG. 12. After formation of the tungsten plugs 34 and the ILD 32, the processing of FIGS. 3–11 commences as previously described.

As fully discussed in FIGS. 3–11, the layers 26–64b are formed as illustrated in FIGS. 3–11 to complete the IC 14 illustrated in part by FIG. 12. Note that the layer 52 and the layer 54 are preferably formed from the same copper material whereas layer 52 is formed by electroless plating and layer 54 is formed by electroplating. Therefore, it will be difficult to discern the boundary between the layer 52 and the layer 54 in the final device. Furthermore, a chemical mechanical processing (CMP) operation is utilized in FIG. 12 in order to polish upper portions of the layer 54 to result in dual in-laid contacts/interconnects. Note that FIG. 8 illustrates that the contact portions comprise the barrier 48, the catalyst layer 64b, and the copper interconnect material 52 and 54. As previously noted, the layer 50 was removed from the active area portion of the wafer so that layer 50 will not adversely affect the contact resistance of the dual in-laid structures of FIG. 12. While not affecting resistance, the dual in-laid structure of FIG. 12 is improved over the contact structure formed via the process of FIGS. 1 and 2 due to improved prevention of copper electroplating within the edge exclusion region 20 and improved copper interconnect formation via the use of electroless copper as a electroplating seed layer.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, additional barrier layers other than layers 48 and 50 can be placed within a dual in-laid contact opening before the copper is formed. Also note that the solutions discussed hereinbove to perform wet surface processing may be diluted with DI water. Therefore, it is intended that this invention encompasses all the variations and modifications as fall within the scope of the appended claims.

What is claimed is:

1. A method for making a metal layer on a surface of a substrate, the method comprising:
   providing the substrate having an edge surface portion and a central surface portion;
   forming a metallic layer overlying the surface of the substrate, the metallic layer overlying both the edge surface portion and the central surface portion of the substrate;
   forming an intermediate layer overlying the metallic layer;
   etching portions of the intermediate layer so that the intermediate layer remains only within the edge surface portion and is substantially removed from the central surface portion to expose portions of the metallic layer, wherein an exposed intermediate layer portion is formed within the edge surface portion;
   after etching portions of the intermediate layer depositing a seed layer overlying the metallic layer wherein the seed layer overlies the central surface portion but does not overlie the intermediate layer; and
   electroplating a metallic region from the seed layer wherein the exposed intermediate layer portion prevents substantial electroplating within the edge surface portion of the substrate.

2. The method of claim 1, wherein depositing a seed layer further comprises depositing the seed layer as a electroless plated copper layer.

3. The method of claim 1, wherein etching portions of the intermediate layer comprises exposing the intermediate layer to an acidic spray or an acidic bath to result in removal of the portions of the intermediate layer.

4. The method of claim 3, wherein etching portions of the intermediate layer comprises exposing the intermediate layer to an acidic spray or an acidic bath comprising HF.

5. The method of claim 3, further comprising:
   exposing portions of the metallic layer to a basic spray or basic bath after etching portions of the intermediate layer;
   exposing portions of the metallic layer to an acidic spray or an acidic bath after exposing portions of the metallic layer to a basic spray or basic bath;
   depositing a thin monolayer of material over exposed portions of the metallic layer; and
   electroless plating a copper seed layer from the thin monolayer of material to result in the deposition of the seed layer.

6. The method of claim 5, further comprising electroplating a copper layer on top of the copper seed layer.

7. The method of claim 1 further comprising exposing portions of the metallic layer to a basic spray or basic bath after etching portions of the intermediate layer.

8. The method of claim 7, further comprising exposing portions of the metallic layer to an acidic spray or an acidic bath after exposing portions of the metallic layer to a basic spray or basic bath.

9. The method of claim 1, further comprising exposing portions of the metallic layer to an acidic spray or an acidic bath after etching portions of the intermediate layer.

10. The method of claim 1, further comprising depositing a layer of material over exposed portions of the metallic layer.

11. The method of claim 10, wherein depositing a layer of material comprises depositing the layer of material as a catalyst layer for copper electroless plating.

12. The method of claim 10, wherein depositing a layer of material comprises depositing the layer of material as colloid comprising tin and palladium.

13. The method of claim 10, wherein depositing a layer of material comprises depositing the layer of material as colloid comprising two metallic atoms.

14. The method of claim 13, further comprising exposing the layer of material to an ambient that removes one of the two metallic atoms from the layer of material while leaving another of the two metallic atoms behind to form a modified layer of material.

15. The method of claim 1, wherein the metallic layer is a tungsten nitride layer and the intermediate layer is a tungsten silicide layer.

16. The method of claim 1, wherein:
   the substrate has an outer edge; and
   the edge surface portion extends no greater than approximately 3 mm from the outer edge.

17. The method of claim 1, wherein:
   the central surface portion includes integrated circuits; and
   the edge surface portion surrounds the integrated circuits.

18. A method for making a copper layer on a surface of a semiconductor wafer, the method comprising:
   providing the semiconductor wafer having an edge surface portion around a periphery of the semiconductor wafer and a central surface portion near a center of the semiconductor wafer;
   forming a first metal interconnect layer;
   forming an inter-level dielectric layer overlying the first metal interconnect layer;
   forming at least one opening through the inter-level dielectric layer, the at least one opening through the inter-level dielectric layer having a trench portion and a via portion wherein the via portion contacts to the first metal interconnect layer;
   forming a barrier layer over the inter-level dielectric layer and within the at least one opening, the barrier layer comprising tungsten and nitrogen;
   forming a silicon-comprising layer overlying the barrier layer;
   removing portions of the silicon-comprising layer so that the silicon-comprising layer only lies within the edge surface portion of the semiconductor wafer and portions of the barrier layer are exposed within the central surface portion;
   forming a metallic catalytic seed layer on exposed portions of the barrier layer after removing portions of the silicon-comprising layer;

forming an electroless copper seed layer overlying the metallic catalytic seed layer wherein:
 the silicon-comprising layer substantially prevents formation of the electroless copper seed layer over the edge surface portion; and
 exposing the electroless copper seed layer to a copper electroplating environment wherein copper is electroplated onto the electroless copper seed layer while the silicon-comprising layer substantially prevents copper from electroplating within the edge surface portion.

19. The method of claim 18, wherein the barrier layer is a tungsten nitride layer and the silicon-comprising layer is a tungsten silicide layer.

20. The method of claim 18, wherein the silicon-comprising layer is oxidized.

21. The method of claim 18, wherein:
 the semiconductor wafer has an outer edge; and
 the edge surface portion extends no greater than approximately 3 mm from the outer edge.

22. The method of claim 18, wherein:
 the central surface portion includes integrated circuits; and
 the edge surface portion surrounds the integrated circuits.

23. A method for making a conductive layer comprising copper on a surface of a semiconductor wafer, the method comprising:
 forming a plating barrier region around an edge exclusion portion of a wafer;
 forming a catalyst layer within a central portion of the wafer;
 electroless plating copper from the catalyst layer to form a copper seed wherein the plating barrier region prevents substantial copper from forming over the edge exclusion portion of the wafer; and
 forming more copper over the copper seed to form a copper region of an integrated circuit on the wafer.

24. The method of claim 23, wherein forming the catalyst layer comprises:
 forming a barrier layer prior forming the plating barrier region;
 exposing the barrier layer on the wafer to a basic spray or basic bath;
 exposing the barrier layer to an acidic spray or an acidic bath; and
 depositing a thin monolayer of material over the barrier layer to form the catalyst layer.

25. The method of claim 23, wherein:
 the semiconductor wafer has an outer edge; and
 the edge exclusion portion extends no greater than approximately 3 mm from the outer edge.

26. The method of claim 23, wherein:
 the central portion includes integrated circuits; and
 the edge exclusion portion surrounds the integrated circuits.

* * * * *